(12) United States Patent
Yaegashi et al.

(10) Patent No.: US 6,784,064 B2
(45) Date of Patent: Aug. 31, 2004

(54) HETEROJUNCTION BIPOLAR TRANSISTOR AND METHOD OF MAKING HETEROJUNCTION BIPOLAR TRANSISTOR

(75) Inventors: Seiji Yaegashi, Yokohama (JP); Kenji Kotani, Yokohama (JP); Masaki Yanagisawa, Yokohama (JP); Hiroshi Yano, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/026,950

(22) Filed: Dec. 27, 2001

(65) Prior Publication Data

US 2002/0105011 A1 Aug. 8, 2002

(30) Foreign Application Priority Data

Dec. 27, 2000 (JP) ........................................ 2000-398417

(51) Int. Cl.$^7$ .............................................. H01L 2/331
(52) U.S. Cl. ....................... 438/317; 438/338; 438/342; 438/343
(58) Field of Search .......................... 438/20, 317, 342, 438/343, 344, 345, 346, 338, FOR 471, FOR 472

(56) References Cited

U.S. PATENT DOCUMENTS 4,801,986 A * 1/1989 Chang et al. ................ 257/139
5,614,423 A * 3/1997 Matsuoka et al. ........... 438/312
6,333,236 B1 * 12/2001 Koganei ...................... 438/312

FOREIGN PATENT DOCUMENTS

| JP | 5-48078 | 2/1993 | |
|----|---------|--------|--|
| JP | 5-243257 | 9/1993 | |
| JP | 8-139101 | 5/1996 | |
| JP | 10050720 A | * 2/1998 | ......... H01L/21/331 |

* cited by examiner

Primary Examiner—T. Thomas
Assistant Examiner—Paul E Brock, II
(74) Attorney, Agent, or Firm—Smith, Gambrell & Russell, LLP

(57) ABSTRACT

A method of making a heterojunction bipolar transistor comprises the steps of: forming a mask layer on a compound semiconductor film by using a photomask for forming an emitter; and forming the emitter by wet-etching the compound semiconductor film by using the mask layer. The photomask has a pattern thereon for forming the emitter. The pattern is defined by a first area R associated with the shape of the emitter to be formed, and a plurality of second areas $T_1$ to $T_4$. Each of the second areas $T_1$ to $T_4$ includes first and second sides $S_1$ and $S_2$ meeting each other to form an acute angle therebetween, and a third side $S_3$ in contact with the first area R. In each of the second areas $T_1$ to $T_4$, one side $S_3$ of the two sides meeting each other to form a right angle therebetween is in contact with one side of the area R, whereas the other side $S_1$ is connected to another side of the first area R to form a line segment. Using this photomask, an etching mask is arranged such that a side $S_{11}$ of the first area R is oriented in [001] direction of the emitter crystal film. When the emitter crystal film is etched by use of the etching mask, a rectangular emitter is obtained.

10 Claims, 11 Drawing Sheets

| FILM NAME | MATERIALS | CONDUCTIVE TYPE | DOPANT | CARRIER CONCENTRATION (cm$^{-3}$) | FILM THICKNESS (nm) |
|---|---|---|---|---|---|
| EMITTER FILM 6 | InP | n | Si | $4 \sim 20 \times 10^{18}$ | 250 |
| BASE FILM 5 | InGaAs | p$^+$ | Zn | $4 \times 10^{19}$ | 50 |
| COLLECTOR FILM 4 | InGaAs | n | Si | $5 \times 10^{16}$ | 500 |
| SUBCOLLECTOR FILM 3 | InGaAs | n$^+$ | Si | $1 \times 10^{19}$ | 300 |

HETEROJUNCTION BIPOLAR TRANSISTOR AND METHOD OF MAKING HETEROJUNCTION BIPOLAR TRANSISTOR

BACKGROUND OF THE INVENTION

1. Field of the Invention

The present invention relates to a method of making a heterojunction bipolar transistor and a compound semiconductor heterojunction bipolar transistor.

2. Related Background Art

Heterojunction bipolar transistors (HBTs) have a high current gain and are excellent in high-frequency characteristics, whereby they have been utilized as amplifiers for transmitters and receivers in high-speed optical communication systems. HBTs exhibit these excellent characteristics because their emitter region is constituted by a semiconductor material having an energy band gap (Eg) greater than that of their base region. The heterojunction allows the emitter injection efficiency to increase even when the carrier concentration of the base region is made high.

SUMMARY OF THE INVENTION

The inventors have been studying heterojunction bipolar transistors which are excellent in high-frequency characteristics. The inventors' investigations have revealed that there are various causes which deteriorate high-gain characteristics and high-frequency characteristics of heterojunction bipolar transistors. Various improvements for eliminating these causes have been proposed for heterojunction bipolar transistors. For example, Japanese Patent Application Laid-Open Nos. 05-48078 and 08-139101 publications disclose heterojunction bipolar transistors.

Figure 13A:
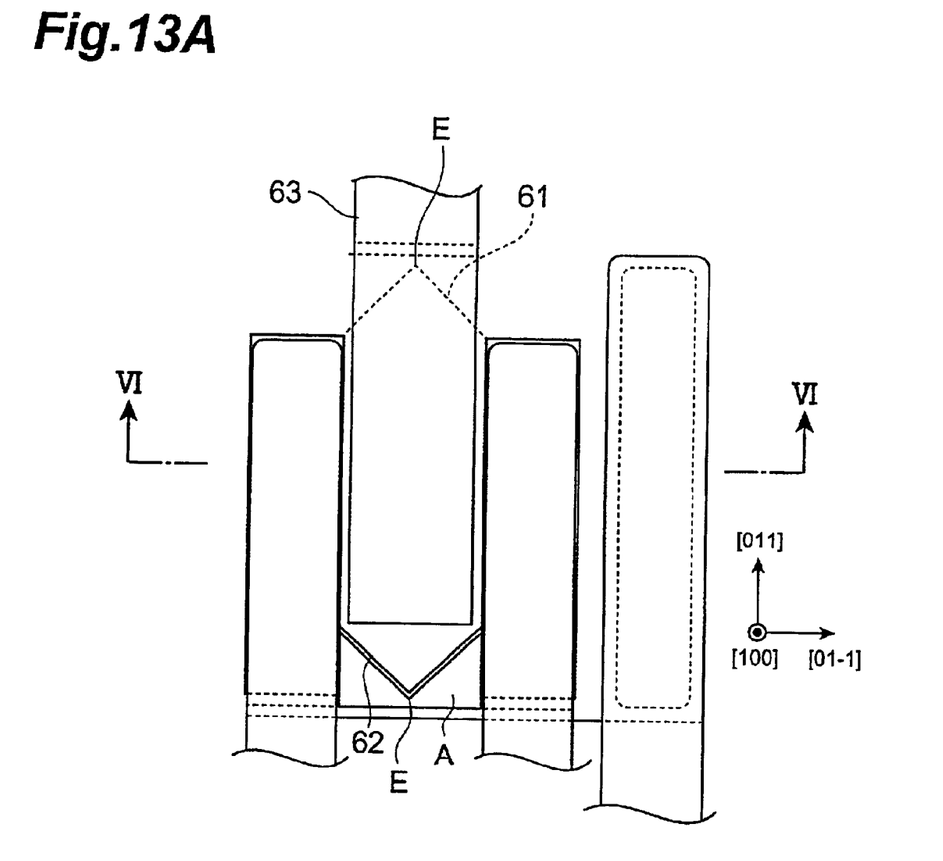
FIG. 13A is a plan view showing an example of structure of a heterojunction bipolar transistor for comparison.
Figure 13B:
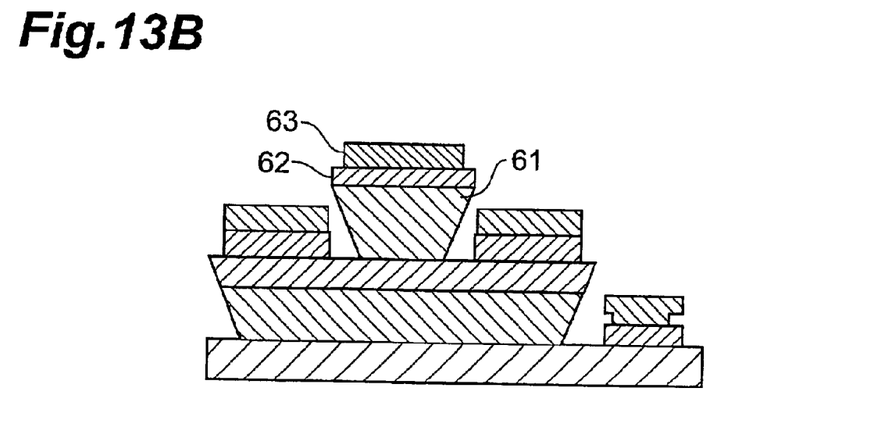
FIG. 13B is a sectional view taken along the line VI—VI in FIG. 13A.

FIG. 13A is a plan view showing an example of the structure of a heterojunction bipolar transistor utilized by the inventors for consideration. FIG. 13B is a sectional view taken along the line VI—VI in FIG. 13A. A mask layer for etching is formed on an epitaxially grown emitter layer. The mask layer has a rectangular form. Anisotropic wet etching is carried out by using this mask layer to form an emitter 61. The emitter 61 of this transistor has an inverted mesa structure at a pair of its sides. When the emitter 61 is formed by anisotropic wet etching, the etching rate however varies depending on the orientation of crystals, so that the emitter region 61 has a hexagonal form as shown in FIG. 13A. In FIG. 13A, the angle indicated by reference symbol E becomes 90 degrees due to the crystal orientation of semiconductor material of emitter. In this transistor, a wiring lead 63 connects an emitter electrode 62 on the emitter region 61 to another circuit. The emitter 61 of the transistor is hexagonal and the wiring lead 63 extends in the longitudinal direction of the emitter region 61, so that the lead 63 is arranged to pass over the corner indicated by reference symbol E. In this arrangement, a greater stress occurs in the vicinity of the angle part E than in other parts of the wiring lead 63. Since the reliability tends to deteriorate due to this stress, it will take a long period to secure acceptable reliability.

When the emitter has a hexagonal form, the base area disposed under the emitter is inevitably larger. When the area of the base is large, the junction capacitance between the base and the collector disposed under the base (hereinafter referred to as base-collector capacitance) increases. When the junction capacitance increases, the operating speed of HBT decreases.

Japanese Patent Application Laid-Open No. 05-243257 publication discloses an emitter disposed so as to orient in [001] direction. In this configuration, the emitter region has a rectangular form and can solve the problem mentioned above. According to the inventors' investigations, however, the emitter region has no side of inverted mesa structure. In order to form an emitter electrode and base electrodes by a self-alignment process in this configuration of the HBT, it is necessary that side faces of the emitter region be etched after an emitter cap layer is formed on the emitter.

Therefore, it is an object of the present invention to provide a method of making a heterojunction bipolar transistor which is excellent in high-frequency characteristics, and a heterojunction bipolar transistor.

In one aspect, the present invention relates to a method of making a heterojunction bipolar transistor. This method comprises the steps of: (a) making a mask layer on a compound semiconductor layer with a photomask for forming an emitter; and (b) forming an emitter region by wet-etching the compound semiconductor layer with the mask layer. The photomask has a pattern thereon for forming the emitter region. The pattern is constituted by a first area part associated with a shape of the emitter to be formed, and a plurality of second area parts. Each of the second area parts includes first and second sides that meet each other to form an acute angle therebetween, and a third side in contact with the first area part.

In another aspect, the present invention relates to a method of making a heterojunction bipolar transistor. This method comprises the step of: (a) forming on a compound semiconductor layer a mask layer for forming an emitter; and (b) forming an emitter region by wet-etching the compound semiconductor layer with the mask layer. The mask layer has a pattern for forming the emitter region. The pattern has a first pair of edges extending in a predetermined direction, a second pair of edges extending in a direction intersecting the predetermined direction, and a mask part projecting from at least one edge of the first pair of edges. The mask part has an edge portion extending in a direction of a line inclined toward the edge of the first pair of edges.

In still another aspect, the present invention relates to a heterojunction bipolar transistor. This transistor comprises a collector, abase, and an emitter. The transistor has a first mesa including the collector and the base, and a second mesa including the emitter. The emitter is provided on the first mesa and contains a compound semiconductor. The emitter has a first pair of sides extending in a predetermined direction, and a second pair of sides extending in another direction intersecting the predetermined direction. The first pair of sides of the emitter are provided with an inverted mesa structure, whereas the second pair of sides thereof are provided with a normal mesa structure.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

The present invention will easily be understood in view of the following detailed description with reference to the accompanying drawings, wherein:

FIG. 7A is a plan view showing a heterojunction bipolar transistor prepared by the method of the above-mentioned embodiment, whereas

The above-mentioned object, other objects, features, and advantages of the present invention will be seen more easily from the following detailed descriptions of preferred embodiments of the present invention set forth with reference to the accompanying drawings.

DETAILED DESCRIPTION OF THE PREFERRED EMBODIMENTS

Embodiments of the present invention will be explained with reference to the drawings. Constituents identical to each other among the drawings will be referred to with reference numerals identical to each other, if possible.

In the following, embodiments of the method of making a bipolar transistor in accordance with the present invention will be explained. In particular, a case preparing a III–V group compound semiconductor heterojunction bipolar transistor (referred to as HBT) will be explained.

First Embodiment

FIGS. 1A to 1F are schematic views showing cross sections of a heterojunction bipolar transistor in respective steps of the method of making the heterojunction bipolar transistor in accordance with a first embodiment. The method of this embodiment comprises a crystal growing step, an emitter mesa forming step, a base-collector mesa forming step, an isolation step, and an electrode forming step. These steps are carried out in succession.

Crystal Growing Step

Figure 1A:
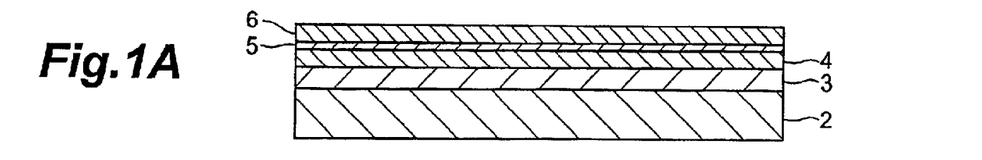
FIGS. 1A to 1F are schematic views showing cross sections of a heterojunction bipolar transistor in respective steps of the method of making a heterojunction bipolar transistor in accordance with the first embodiment.
Figure 2:
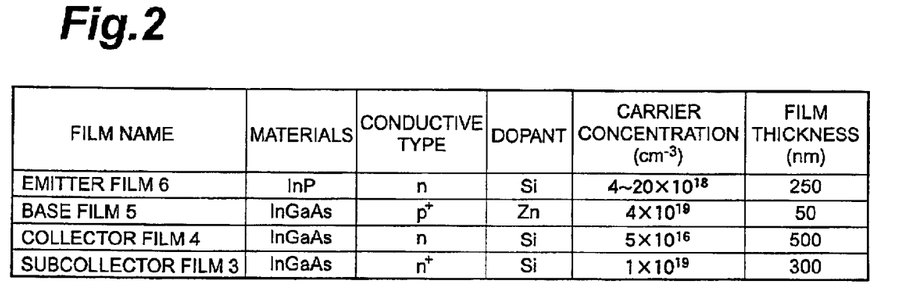
FIG. 2 is a chart showing semiconductor materials, conduction types, dopants, carrier concentrations, and film thicknesses of the respective semiconductor films grown epitaxially.

FIG. 1A shows the crystal growing step. In this step, a subcollector film 3, a collector film 4, a base film 5, and an emitter film 6 are grown successively on the (100) surface of a semi-insulating InP substrate 2. These semiconductor films 3 to 6 are formed by an epitaxial growth method by use of a metal organic chemical vapor deposition (MOCVD) apparatus. FIG. 2 exemplifies the semiconductor materials, conduction types, dopants, carrier concentrations, and film thicknesses of the semiconductor films 3 to 6, respectively. The following explanations will describe a method of making a transistor in which the subcollector semiconductor film 3, collector semiconductor film 4, and base semiconductor film 5 are constituted by an $In_xGa_{1-x}As$ semiconductor, whereas the emitter semiconductor film 6 is constituted by an InP semiconductor, but the present invention is not restricted to the above-mentioned case. The composition ratio x is chosen so that $In_xGa_{1-x}As$ semiconductor lattice-matches InP semiconductor of the substrate 2, and preferably the ratio x is 0.53. The lattice match means that the lattice constant difference ranges from about +0.1% to about −0.1%.

The semiconductor films 3 to 6 can be formed using, as materials, triethyl gallium (TEGa), trimethyl indium (TMIn), arsine ($AsH_3$), and phosphine ($PH_3$). In order to grow the semiconductor films 3 to 6, materials appropriately selected from the above materials are supplied to the chamber of an MOCVD apparatus. The supply amount of each selected material is appropriately adjusted, so that the semiconductor films 3 to 6 are formed so as to yield a predetermined composition ratio. The growing temperature of the semiconductor films 3 to 6 preferably falls within the range of 600° C. to 750° C. for each of the semiconductor films in order for the semiconductor films to have a favorable crystallinity.

The semiconductor films 3, 4 and 6 exhibit n-type conductivity. For yielding a semiconductor film of this conduction type, a doping gas of $SiH_4$ is supplied during its growth at such a flow rate that a predetermined carrier concentration is obtained. The impurity profile of the emitter film 6 may be tilted as well. For obtaining such a profile, the supplying amount of dopant $SiH_4$ is gradually increased during the growth of the emitter film 6. As a consequence, the carrier concentration of the emitter film 6 changes so as to become relatively lower (e.g., $4 \times 10^{18}$ cm$^{-3}$) in a region, adjacent to an interface with the base film, of the emitter film 6 and so as to become relatively higher (e.g., up to about $2 \times 10^{19}$ cm$^{-3}$) as being distanced away from the base film 5. Due to the higher carrier concentration, an ohmic contact is easily realized between the emitter film 6 and an emitter electrode 16 formed thereon.

When growing the base film 5 of p-type conductivity, diethyl zinc (DEZn) is supplied at a predetermined flow rate. When carbon tetrabromide ($CBr_4$) is used in place of DEZn, carbon (C) can be added to the base film 5 as an acceptor impurity. Since the hole concentration of the base film 5 can be made higher due to the doping of carbon, the transistor can improve its high-frequency characteristics.

Emitter Mesa Forming Step

Figure 1B:
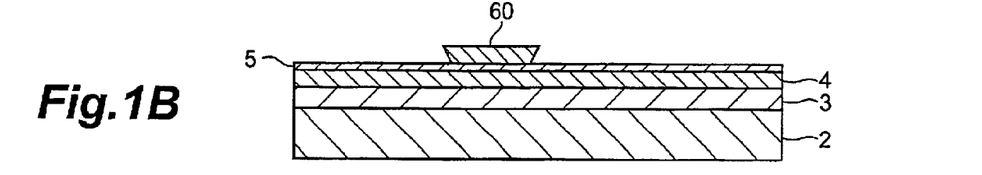

Subsequently, as shown in FIG. 1B, an emitter layer, a base layer, and a collector layer are formed in a mesa forming step. The mesa forming step comprises an emitter mesa forming step for forming an emitter layer 60, and a base mesa forming step for forming a base-collector mesa portion 45. First, the emitter mesa forming step will be explained.

A resist film is formed on the emitter film 6 on the InP substrate 2. Thereafter, the resist film is exposed to light by way of a photomask by photolithography method. An etching mask layer (hereinafter referred to as mask layer) is obtained on the emitter film 6. The photomask has a pattern for forming the emitter layer. This pattern is transferred to the resist film upon exposure to light and developed in a developing solution, so that a mask layer having the transferred pattern is obtained.

Figure 3:
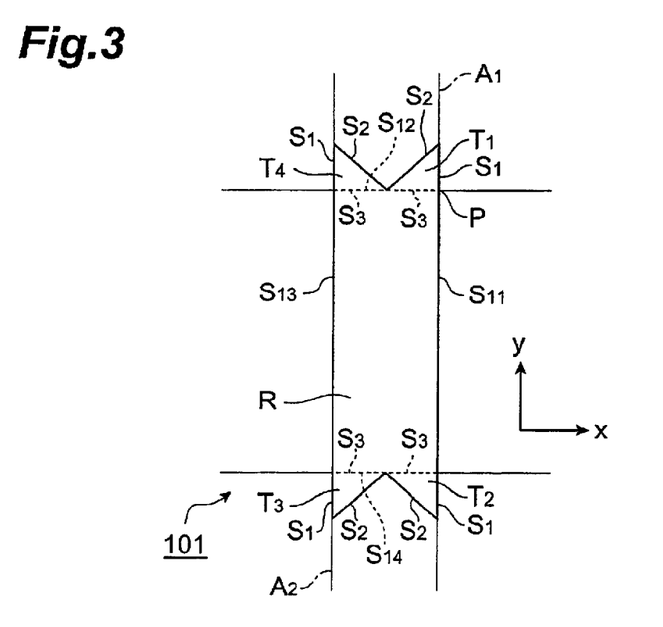
FIG. 3 is a plan view showing a pattern of a photomask.

FIG. 3 is a plan view showing the pattern of the photomask used for forming the etching mask. The shape of the pattern will be explained with reference to FIG. 3. The photomask is used for forming the etching mask on the emitter film, and the etching mask is used to form the emitter layer 60 by etching. This pattern 101 comprises an area R (first area) and a plurality of areas $T_1$ to $T_4$ (second areas). The shape of area R is associated with the shape of the emitter to be formed. The area R is a rectangle defined by a first pair of lines extending in the x direction shown in the drawing, and a second pair of lines extending in the y direction orthogonal to the x direction. Each of the areas $T_1$ to $T_4$ is a triangle defined by sides $S_1$ and $S_2$ meeting each other to form an acute angle therebetween, and a side $S_3$ (indicated by a dotted line) which is connected with the sides $S_1$ and $S_2$. In a preferred example, each of the regions $T_1$ to $T_4$ is a rectangular equilateral triangle in which the sides $S_1$ and $S_2$ have the same length whereas the sides $S_1$ and $S_3$ meets each other to form an angle of 90° therebetween.

Referring to FIG. 3, the side $S_3$ of the area $T_1$ is in contact with a side $S_{12}$ of the area R in the pattern 101. The side $S_1$ of the area $T_1$ and the side $S_{11}$ of the area R are positioned on a reference line $A_1$. The point shared by the sides $S_1$ and $S_3$ is positioned on a vertex P of the area R. The side $S_1$ is connected to the side $S_{11}$ so as to form a line segment. The side $S_3$ of the area $T_2$ is in contact with the side $S_{14}$ of the area R. The side $S_1$ of the area $T_2$ is positioned on the reference line $A_1$, so that the side $S_1$ of the area $T_2$ is connected to a side $S_{11}$ of the area R to form a line segment. The side $S_3$ of the area $T_3$ is in contact with the side $S_{14}$ of the area R. The side $S_1$ of the area $T_3$ and the side $S_{13}$ of the area R are positioned on a reference line $A_2$. The side $S_1$ of the area $T_3$ is connected to the side $S_{13}$ of the area R so as to form a line segment. The side $S_3$ of the area $T_4$ is in contact with the side $S_{12}$ of the area R. The side $S_1$ of the area $T_4$ is positioned on the reference line $A_2$ and is connected to the side $S_{13}$ of the area R so as to form a line segment.

Using a photomask having the pattern 101, an etching mask is formed on the emitter film 6 such that the side $S_{11}$ of the area R is oriented in [011] direction (the x-axis direction in the coordinate system of FIG. 3). Then, the exposure and development is carried out in the photolithography step to obtain this etching mask. After the photolithography step, an etching mask is formed on the emitter film 6 and has a shape formed by transferring thereto the pattern 101 shown in FIG. 3. The pattern 101 can yield the rectangular emitter layer 60.

Figure 4:
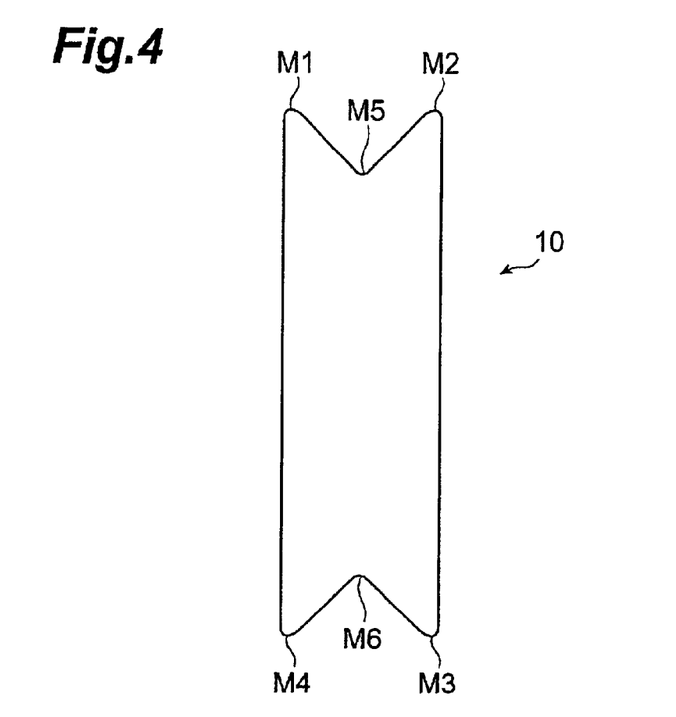
FIG. 4 is a plan view showing a resist-made etching mask which has been exposed to light by use of the photomask and developed in a developing solution.

FIG. 4 is a plan view showing a resist-made etching mask which has been exposed to light through the photomask and developed. The shape of this mask pattern 10 of the etching mask reflects the shape of the pattern 101 provided on the photomask. In the mask pattern 10, however, parts M1 to M6 corresponding to the vertices of the pattern 101 of the photomask are rounded due to the resolution of the resist material. Therefore, fine forms exceeding the resolution of resist are not technically important in the pattern of photomask.

After the etching mask has been formed, the InP substrate 2 is subjected to an etching solution so as to eliminate a predetermined portion of the emitter film 6. As shown in FIG. 1B, an InP emitter mesa is formed in the mesa forming step. As the etching solution, a mixed solution of hydrochloric acid and pure water ($HCl:H_2O=3:5$) can be used. This mixed solution exhibits a high etching rate with respect to the emitter film 6 made of InP, but a very low speed with respect to the base film 5 made of InGaAs. Hence, this mixed solution is capable of can selectively etching the InP film against the InGaAs film 5. Namely, the mixed solution exhibits an etching selectivity. However, an etching solution having no etching selectivity can also be used. In this case, an etching rate should be obtained by a preliminary experiment, and the etching time is determined according to thus obtained etching rate.

Figure 5:
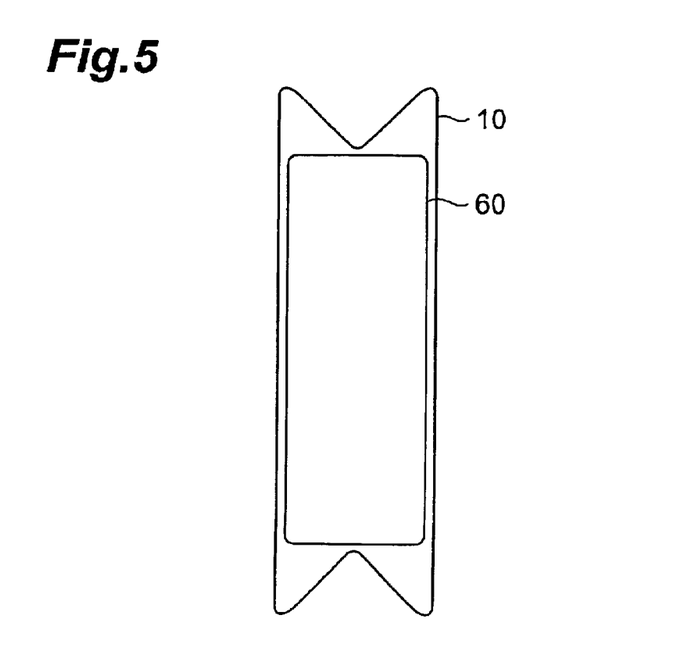
FIG. 5 is a plan view showing an etching mask and an emitter layer.

The emitter layer 60 is formed by the foregoing steps. FIG. 5 is a plan view showing the etching mask 10 and the emitter layer 60. Referring to FIG. 5, a substantially rectangular emitter 60 is formed after the etching is terminated. Although the four corners of the emitter layer 60 are rounded by etching, the emitter layer 60 in FIG. 5 is substantially defined by four sides. The depicted emitter layer 60 will be referred to as rectangular shaped emitter in this specification.

Figure 6A:
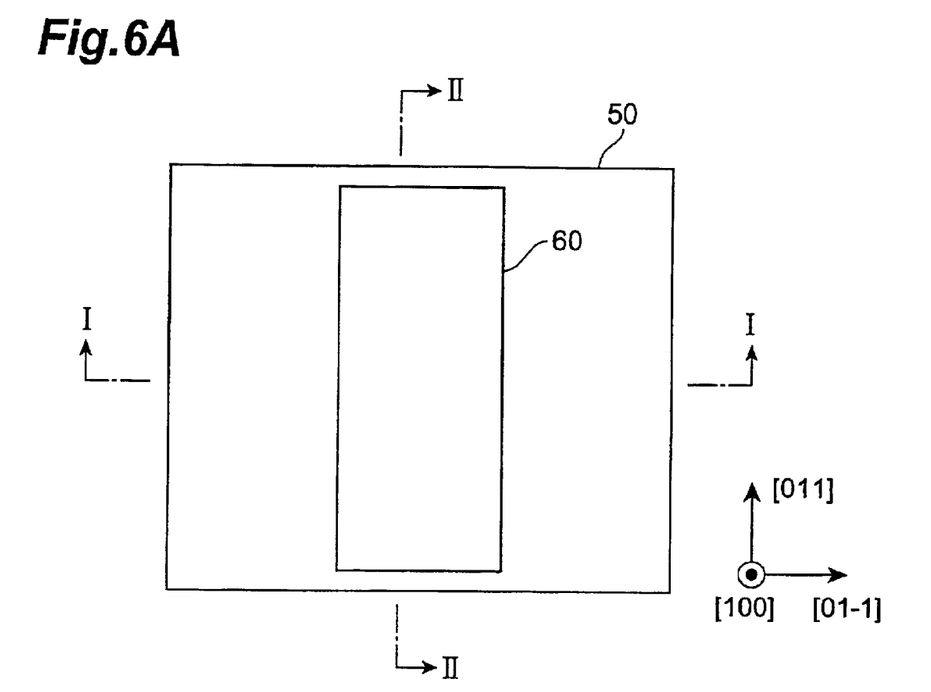
FIG. 6A is a plan view showing the shapes of an emitter mesa and a base-collector mesa which are formed by etching.
Figure 6B:
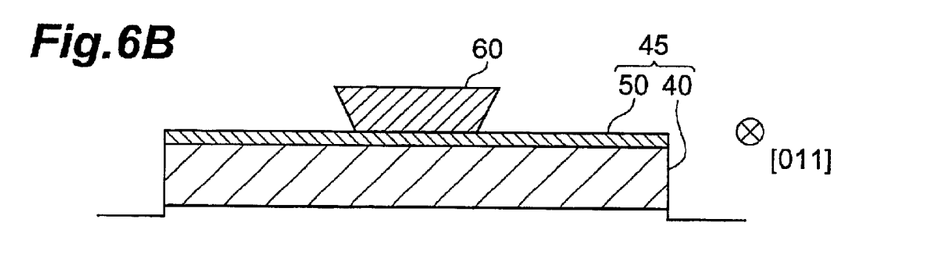
FIG. 6B is a sectional view taken along the line I—I of FIG. 6A.
Figure 6C:
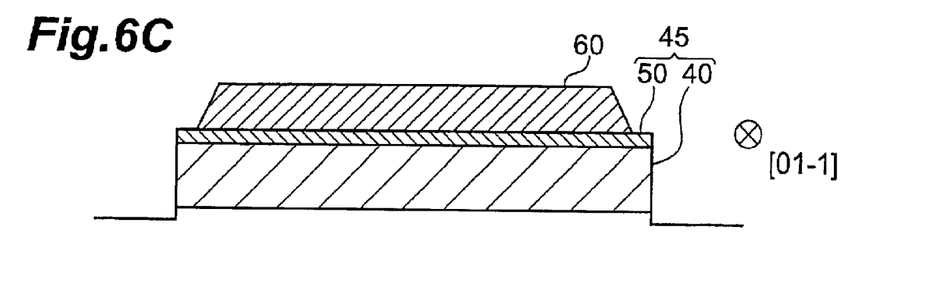
FIG. 6C is a sectional view taken along the line II—II of FIG. 6A.

Referring to FIGS. 6A to 6C, the shape of the emitter layer 60 will be explained in detail. FIG. 6A is a plan view showing the mesa shape of the emitter layer 60 formed by etching. FIG. 6B is a sectional view taken along the line I—I of FIG. 6A. FIG. 6C is a sectional view taken along the line II—II of FIG. 6A and shows the mesa shape of the emitter layer 60.

With reference to FIG. 6A, it is seen that the emitter layer 60 has a substantially rectangular form. This shape reflects the shape of the region R (first planar area), and thus differs from the shape of etching mask shown in FIG. 3.

FIG. 6B is a sectional view taken along the I—I section and shows the mesa shape of the emitter layer 60 after the etching step. The emitter mesa has an inverted mesa structure, as shown in FIG. 6B, at the sides thereof extending in [011] direction of crystal orientation. Each side of the inverted mesa structure is formed in an inverse tapered shape. FIG. 6C is a sectional view taken along the II—II line and shows the mesa shape of the emitter layer 60 after the etching step. As shown in FIG. 6C, the emitter sides extending in [011] direction have a normal mesa structure. Each side of the normal mesa structure is formed in a forward tapered shape.

As will be explained later, base electrodes 15 are formed on the base layer 50 so as to extend in a direction of the edges of the emitter layer 60 extending in [011] direction. This method has an advantage that leakage current between the emitter and base can be lowered because of the inverted mesa structure provided in the above sides of the emitter layer 60.

This method forms a normal mesa structure at the other sides of the emitter layer 60 extending in [011] direction. Therefore, as will be explained later, it can suppress the stress applied to a base lead provided so as to extend in [011] direction.

This method allows the employment of self-alignment method for forming the emitter electrode 16 and the base electrodes 15, and provides the base electrodes 15 formed so as to face the sides of the inverted mesa structure of the emitter layer 60. Hence, it is also advantageous in that the emitter electrode 16 and the base wiring electrodes 15 can be formed in the same step.

As shown in FIG. 6A, the shape of the emitter region 60 differs from that of the etching mask. The inventors think that the reason for the difference in shape is as follows. In the etching of a III–V type compound semiconductor crystal such as InP semiconductor, the etching rate of an etchant varies depending on crystal planes. Referring to FIG. 3 again, etching tends to proceed relatively faster in directions orthogonal to the side $S_2$ (hypotenuse) of each of the regions $T_1$ to $T_4$ but relatively slower in directions orthogonal to the sides of the area R.

A manner in which the etching proceeds will now be explained. The etching starts and the emitter film 6 is etched in the part thereof that is not covered with the etching mask. As the etching process proceeds to etch the surface of emitter film, a particular crystal plane appears at the sides $S_2$ of the areas $T_1$ to $T_4$. Since the etching rate in this crystal plane is higher than that in the other crystal planes, the etching proceeds relatively faster in the former crystal plane. Therefore, the etching proceeds in the emitter film 6 under the area $T_1$ in a direction normal to the side $S_2$ Of the area $T_1$. When the etching further proceeds, the emitter film 6 disappears partly in the triangular region corresponding to the area $T_1$. Similar etching phenomena occur at the part of the emitter film corresponding to the other areas $T_2$ to $T_4$. Hence, the emitter region 60 is thus formed and has a substantially rectangular planar shape reflecting the shape of the area R as shown in the plan view of FIG. 5A.

The typical size of the emitter mesa is as follows:

a width of 1 to 1.5 micrometers; and a length of 2.5 to 3 micrometers.

Base-Collector Mesa Forming Step

The emitter layer 60 is formed by the forgoing steps and the etching mask is eliminated, whereby the emitter mesa forming step ends. Subsequently, a base mesa forming step for forming a base-collector mesa part is carried out. In this step, predetermined parts of the base film 5 and collector film 4 are eliminated so as to partly expose the subcollector film 3.

For forming the base-collector mesa, a resist film is formed on the emitter layer 60 and base film 5. Thereafter, a pattern for the base-collector mesa is transferred to the resist film by photolithography so as to form an etching mask. The pattern covers a region to be formed with the base-collector mesa. The etching mask has a pattern having a pair of sides extending in [011] direction. In this example, the mesa has a rectangular shape. As will be explained later in a second embodiment, the base-collector mesa preferably has a shape defined by eight sides.

Using this etching mask, etching process is carried out by wet etching method. The etchant is a mixed solution containing sulfuric acid ($H_2SO_4$), hydrogen peroxide water ($H_2O_2$), and pure water ($H_2O$) at a ratio of $H_2SO_4:H_2O_2:H_2O=1:1:500$. This etching process is carried out so as to expose the subcollector film 3. The etching amount (depth) is adjusted by the etching time. Therefore, the etching time is determined beforehand such that a desirable etching depth can be achieved. Preferably, in this etching step, the upper layer part of the subcollector film 3 is over-etched by about 100 nm in addition to the collector film 4. This over-etching process can securely eliminate the collector film 4.

This etching process eliminates the parts of base film 5 and collector film 4 that are not covered with the etching mask, so that the subcollector film 3 is exposed. When the etching mask (resist mask) is eliminated by ashing and the like, a rectangular base-collector mesa 45 is obtained.

FIG. 6B is a sectional view taken along the I—I line of FIG. 6A and shows the section of the base-collector mesa 45 after the etching step. After the etching step, the emitter edges extending in [011] direction of crystal orientation have a normal mesa shape. FIG. 6C is a sectional view taken along the II—II and shows the section of the base-collector mesa 45 after the etching step. The emitter edges extending in [011] direction have a normal mesa shape.

Isolation Step

Figure 1C:
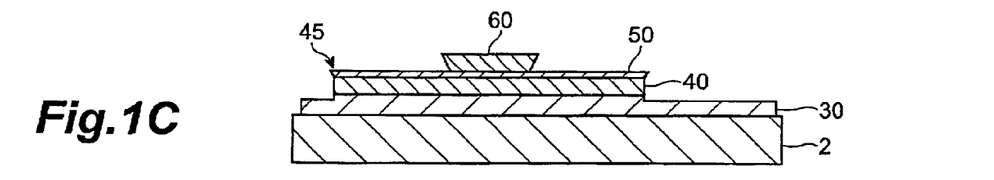

Referring to FIG. 1C, the isolation step will be explained. In the isolation step, a predetermined part of the subcollector film 3 is eliminated by photolithography and etching, so that an isolation region for a transistor is formed. In the isolation region, the subcollector film 3 is etched until the substrate 2 is exposed, whereby a separate subcollector layer 30 is formed for each transistor. The subcollector layer 30 have a mesa shape (a subcollector mesa) on which the base-collector mesa 45 is provided thereon. As a consequence, a plurality of transistors formed on the InP substrate 2 are electrically separated from each other.

Electrode Forming Step

Figure 1D:
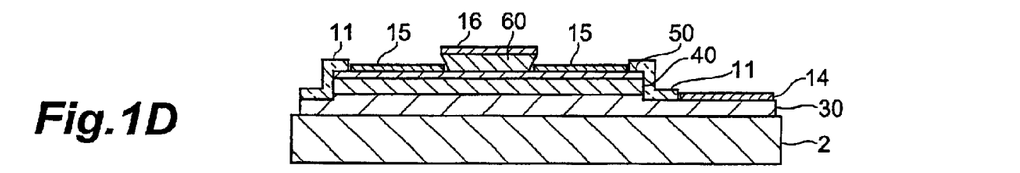

With reference to FIG. 1D, the collector layer 40, base layer 50, and emitter layer 60 are formed with their electrodes 14, 15, 16 thereon, respectively. Subsequently, a step of forming these electrodes is described. After the isolation step, the collector layer 40, base layer 50, and emitter layer 60 are formed on the InP substrate 2. On the semiconductor layers 40, 50 and 60, an insulating film, such as a silicon type inorganic insulating film (e.g., silicon nitride $Si_3Ni_4$, which will herein after be referred to as SiN), is formed by Chemical Vapor Deposition (CVD) method. Thereafter, a resist is provided onto the SiN film to form an etching mask. The etching mask has respective openings with predetermined forms on the collector layer 40, base layer 50, and emitter layer 60, respectively. When plasma etching is carried out with this etching mask, parts of the SiN film are eliminated at the openings of the etching mask. As a result, the SiN film is formed with contact holes reaching the subcollector layer 30, base layer 50, and emitter layer 60, respectively.

After the plasma etching has been carried out, metal layers, such as those of titanium (Ti), platinum (Pt) and gold (Au), are successively deposited on the resist mask and the respective openings thereof. The resist mask has an opening provided over both of the emitter layer 60 and the base layer 50 and is used to form electrodes for the emitter layer 60 and the base layer 50. Since a pair of sides of the emitter extending in [011] direction have inverted mesa form, no metal atom reaches on parts of the base layer 50 that are adjacent to the emitter sides. Since no metal film is formed on these parts, the emitter electrode 16 and the base electrodes 15 can securely be separated from each other. When the metal film for these electrodes is deposited, it is preferable to employ such a deposition method that metal atoms are incident on the InP substrate 2 substantially in a direction normal to the substrate 2. This method can securely separate the base electrodes 15 and the emitter electrode 16 from each other. An example of such a method is vacuum deposition.

The metal film is formed on the etching mask (resist film). When the resist film is removed, undesired portions of the metal film is removed together with the resist film. As a consequence, the emitter electrode 16, base electrodes 15, and collector electrode 14 are formed by liftoff method. The electrodes as shown in FIG. 1D are formed. These electrodes are formed on the respective semiconductor layers. The carrier concentration of each semiconductor layer is at least $1 \times 10^{19}$ cm$^{-3}$ and thus is high sufficient to realize ohmic contact between the electrodes and their corresponding semiconductor layers even without heat treatment such as a step for forming an alloy.

Figure 1E:
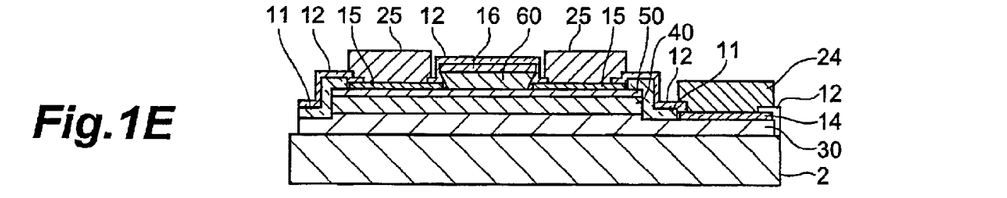

Referring to FIG. 1E, wiring leads 24 and 25 are formed. A step of forming the wiring leads 24 and 25 will now be explained. An insulating film 12, such as a silicon system insulating film, is deposited on the InP substrate 2 by CVD method so as to cover the electrodes 14, 15 and 16. In this embodiment, silicon oxynitride (SiON) is used as the insulating film. A multilayer film, having three layers made of resist/silicon oxide (SiO$_2$)/resist, is formed on the insulating film 12, and then is provided with openings to obtain a multilayer mask layer. The openings are used for forming the wiring leads 24 and 25 for the collector electrode 14 and base electrodes 15. The insulating film 12 is etched by use of the multilayer mask layer to form through-holes for the wiring leads 24 and 25. After a metal film, such as an Al film, has been formed, the part of the metal film on the resist film is removed. The removal is carried out in three-layer liftoff method. Namely, the resist film left on the insulating film 12 is removed so as to eliminate the part of metal film provided on the resist film. As a result, the wiring leads 24 and 25 are formed.

Figure 1F:
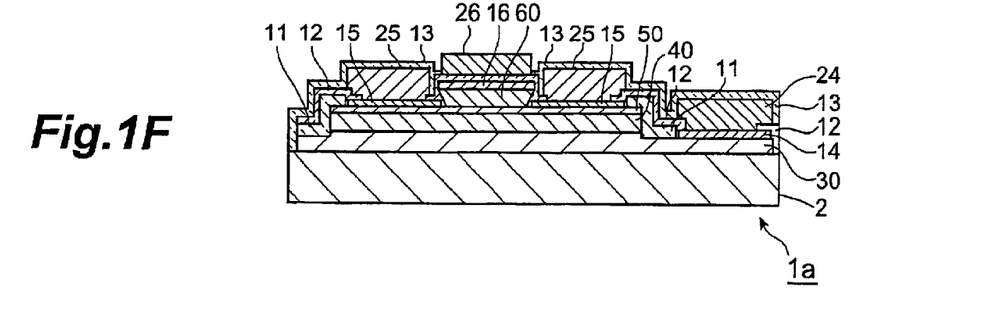

Referring to FIG. 1F, a wiring lead 26 is formed. A step of forming the wiring lead 26 will now be explained. Another insulating film 13, such as a silicon type insulating film, is formed on the InP substrate 2. In this embodiment, SiON is used as the silicon system insulating film. The wiring lead 26 can be formed by a method similar to the procedure by which the wiring leads 24 and 25 are formed, but the method is not limited thereto. As a result of the foregoing steps, a transistor 1a is obtained.

Figure 7A:
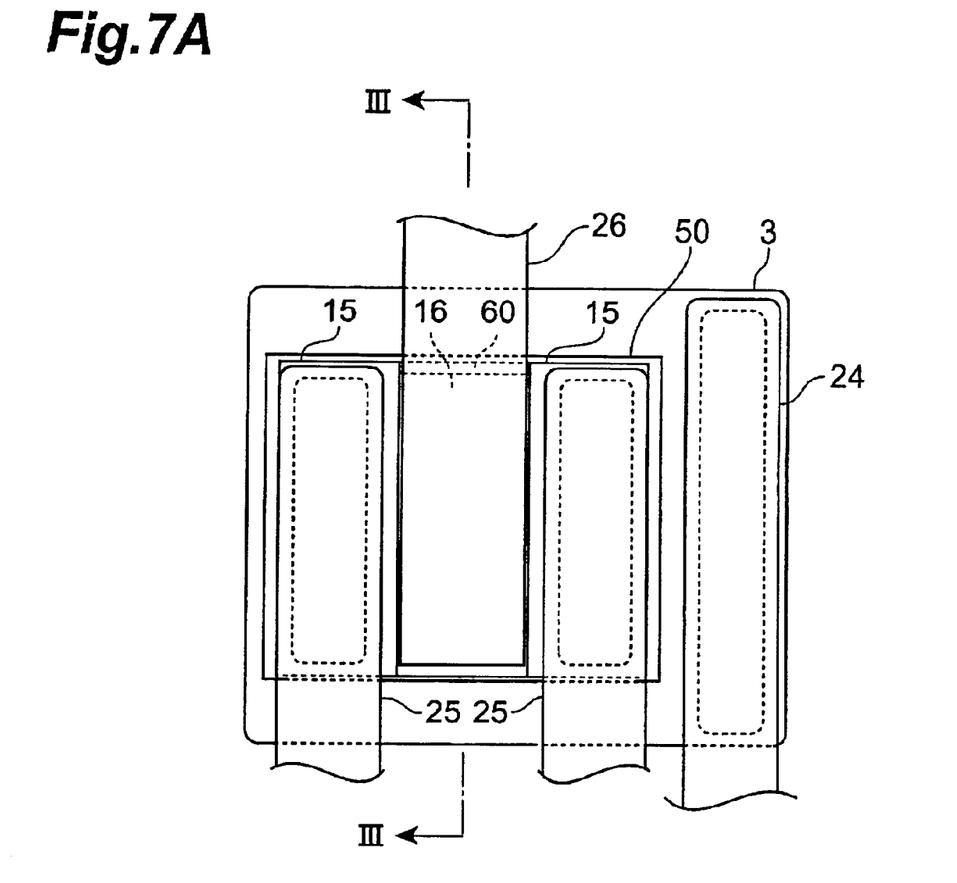
Figure 7B:
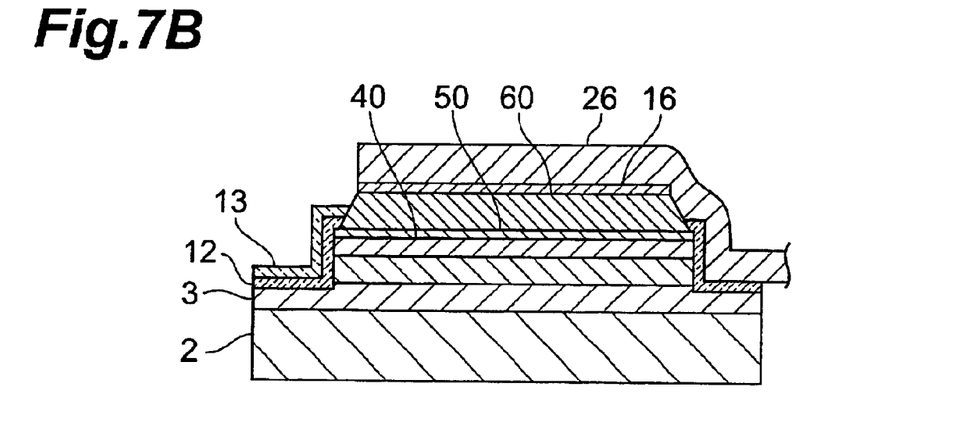
FIG. 7B is a sectional view taken along the line III—III in FIG. 7A.

We will now explain advantages of the transistor 1a prepared by the method of this embodiment. FIG. 7A is a plan view showing the transistor 1a obtained by the above-mentioned method. FIG. 7B is a sectional view taken along the line III—III of FIG. 7A.

When the plan view of a transistor for the comparison shown in FIG. 13A and the plan view shown in FIG. 7A are compared with each other, the following can be seen. Namely, FIG. 13A shows the comparative transistor having a hexagonal emitter region 60 that contains a base region indicated by symbol A. This part is not covered with the emitter layer 60.

According to the inventors' findings, the part A of the comparative transistor does not substantially contribute to the amplification of current, but increases the base-collector capacitance. Due to this capacitance, the high-frequency characteristics of the comparative transistor deteriorate. The transistor 1a in accordance with this embodiment, by contrast, has a structure capable of reducing the area of the base part as indicated by the symbol A.

If the base region in the transistor for comparion has a hexagonal shape corresponding to the shape of the emitter region, this transistor does not have the base part that hardly contributes to the current amplification. When a transistor is provided with an emitter area greater than a predetermined value, the hexagonal emitter region, however, becomes longer than the rectangular emitter region. This configuration prevents the transistor from being made smaller.

By contrast, the transistor a has a substantially rectangular emitter layer 60, so that the transistor 1a does not need the area of the base layer 50 as wide as that of the transistor for comparison. This configuration can reduce the base-collector capacitance. The structure of the transistor 1a prevents the high-frequency characteristics thereof from deteriorating and prevents the size thereof from decreasing.

As shown in FIG. 7A, the emitter wiring lead 26 passes over a shorter side of the emitter layer 60. Since this shorter side is formed with a normal mesa structure, the wiring lead 26 bends at the shorter side while forming an obtuse angle provided by the normal mesa structure. In this configuration, stress is no large applied to the wiring lead 26. Therefore, not only the reliability of the lead 26 can be improved, but also the time interval for an inspecting step such as a screening test can be shortened.

Since longer sides of the emitter layer 60 are formed with an inverted mesa structure, the emitter electrode 16 and the base electrodes 15 can be formed in a self-alignment manner. This manner allows the reliable separation of the emitter electrode 16 from the base electrodes 15 and allows the effective suppression of the leakage current between the emitter and the base.

In the method of making a transistor in accordance with this embodiment, the emitter layer 60 can be formed so as to have a rectangular shape while a pair of sides thereof extend in [011] direction. Since the photomask having the pattern 10 (shown in FIG. 3) is used to carry out the etching process for forming the emitter layer 60, the emitter region 60 can be formed into a substantially rectangular shape.

Second Embodiment

Other embodiments in accordance with the present invention will be explained. A manufacturing method according to each embodiment comprises the same steps as those in the first embodiment except for the step of forming the emitter layer 60 by etching, but they are not limited thereto. In each embodiment, the pattern of a photomask will be explained. This photomask is used to form an etching mask used in the emitter mesa forming step.

Figure 8A:
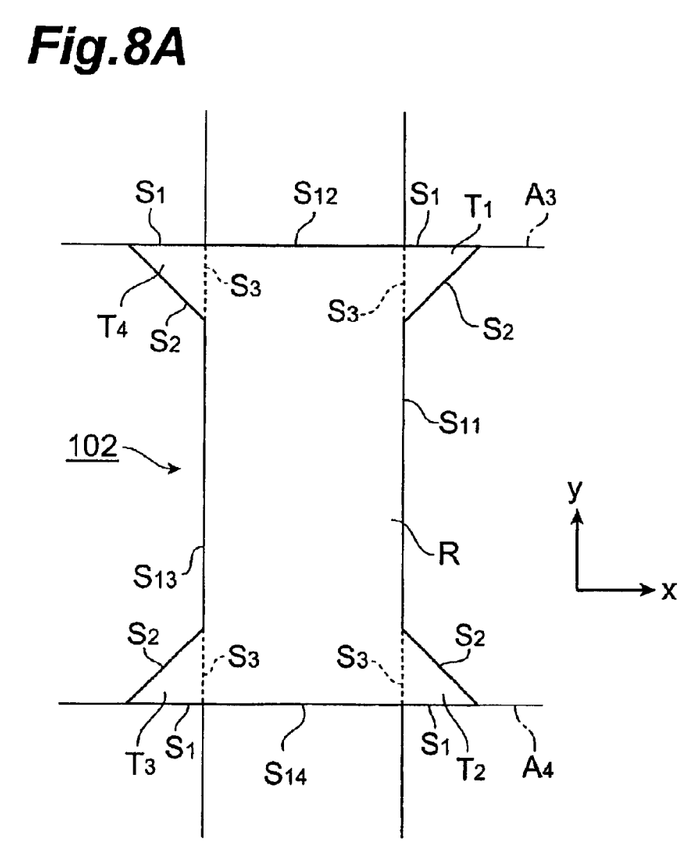
FIGS. 8A and 8B are plan views showing other examples of photomask pattern shapes.

FIG. 8A is a plan view showing a pattern 102 of the photomask in accordance with an embodiment of the present invention. Areas $T_1$ to $T_4$ are arranged so as to come into contact with an area R. Referring to FIG. 8A, a side $S_3$ of the area $T_1$ is in contact with a side $S_{11}$ of the area R. A side $S_1$ of the area $T_1$ is positioned on a reference line $A_3$ extending in the x direction, whereas a side $S_{12}$ of the region R is also positioned on the reference line $A_3$. A side $S_3$ of the area $T_4$ is in contact with a side $S_{13}$ of the area R. A side $S_1$ of the area $T_4$ is positioned on the reference line $A_3$. The side $S_1$ of the area $T_1$ is connected to the side $S_{12}$ of the area R, while the side $S_1$ of the area $T_4$ is also connected to the side $S_{12}$, whereby a line segment is formed. A side $S_3$ of the area $T_2$ is in contact with the side $S_{11}$ of the area R. Aside $S_1$ of the area $T_2$ is positioned on another reference line $A_4$ extending in the x direction. A side $S_3$ of the area $T_3$ is in contact with the side $S_{13}$ of the area R. A side $S_1$ of the area $T_3$ is positioned on the reference line $A_4$. The side $S_1$ of the area $T_2$ is connected to a side $S_{14}$ of the area R, while the side $S_1$ of the area $T_3$ is also connected to the side $S_{14}$, whereby a line segment is formed. As shown in FIG. 8A, the areas $T_1$ to $T_4$ are arranged such that their intersections between the sides $S_1$ and $S_3$ align with the four vertices of the area R, respectively.

When the resist film is actually exposed to light, the pattern 102 is arranged such that the sides $S_{11}$ and $S_{13}$ of the area R orient in [011] direction of crystal orientation (the y-axis direction of the coordinate system in FIG. 8A). After the photolithography step has been carried out, an etching mask is obtained on the emitter film 6 to form a shape formed by transferring thereto the pattern 102 of the photomask shown in FIG. 8A.

Figure 8B:
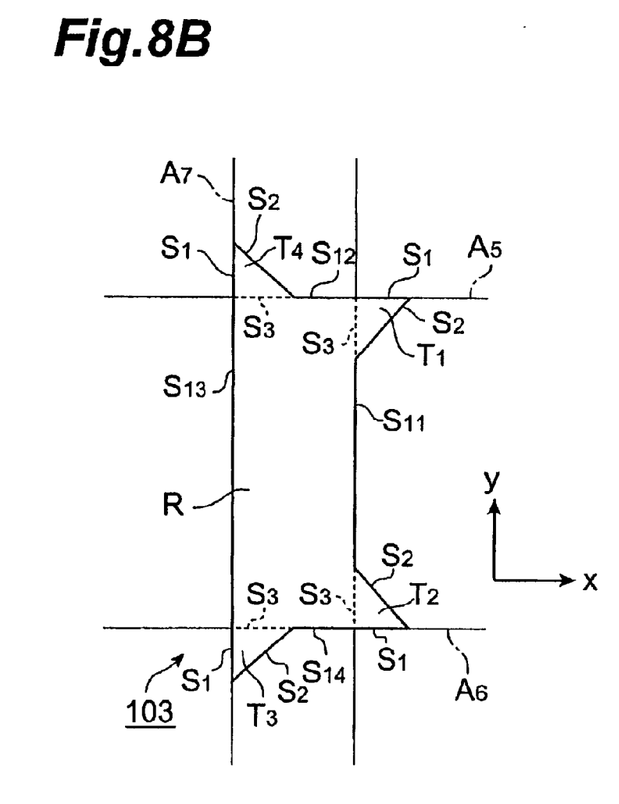

FIG. 8B is a plan view showing a pattern 103 of the photomask in accordance with an embodiment of the present invention. In this pattern 103, a side $S_3$ of the area $T_1$ is in contact with a side $S_{11}$ of the area R. A side $S_1$ of the area $T_1$ is positioned on a reference line $A_5$, and a side $S_{12}$ of the region R is also positioned on the reference line $A_5$. As a consequence, the side $S_1$ of the area $T_1$ is connected to the side $S_{12}$ of the area R to form a line segment. A side $S_3$ of the area $T_2$ is in contact with the side $S_{11}$ of the area R. A side $S_1$ of the area $T_2$ is positioned on another reference line $A_6$, and a side $S_{14}$ of the area R is also positioned on the reference line $A_6$. As a consequence, the side $S_1$ of the area $T_2$ is connected to the side $S_{14}$ of the area R to form a line segment. A side $S_3$ of the area $T_3$ is in contact with the side $S_{14}$ of the area R. A side $S_3$ of the area $T_4$ is in contact with the side $S_{12}$ of the area R. A side $S_1$ of the area $T_3$ is positioned on another reference line $A_8$, and a side $S_{13}$ of the area R is also positioned on the reference line $A_8$. A side $S_1$ of the area $T_4$ is positioned on a reference line $A_7$, and a side $S_{13}$ of the area R is also positioned on the reference line $A_7$. The side $S_1$ of the area $T_4$ and the side $S_1$ of the area $T_3$ are connected to the side $S_{13}$ of the area R to form a line segment. Among the sides $S_1$ of the area $T_1$ to $T_4$, the sides $S_1$ of the areas $T_1$ and $T_2$ are positioned on their respective reference lines $A_5$ and $A_6$ extending in the x direction, whereas the sides $S_1$ of the areas $T_3$ and $T_4$ are positioned on the reference line $A_7$ extending in the y direction.

Figure 9A:
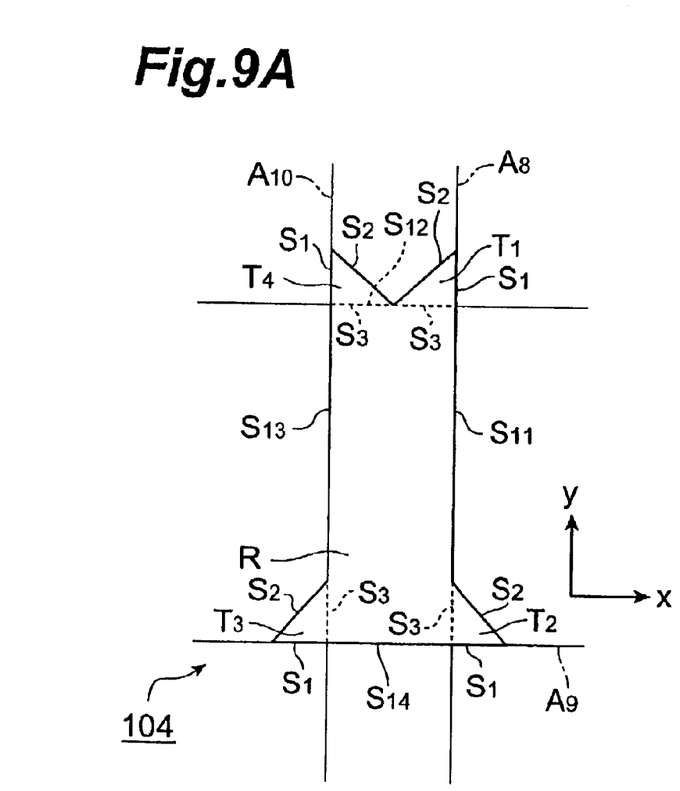
FIGS. 9A and 9B are plan views showing still other examples of photomask pattern shapes.

FIG. 9A is a plan view showing a pattern 104 of the photomask in accordance with an embodiment of the present invention. In the pattern 104, a side $S_3$ of the area $T_1$ is in contact with a side $S_{12}$ of the area R. A side $S_1$ of the area $T_1$ and a side $S_{11}$ of the area R are positioned on a common reference line $A_8$. As a consequence, the side $S_1$ of the area $T_1$ is connected to the side $S_{11}$ of the area R to form a line segment. A side $S_3$ of the area $T_4$ is in contact with a side $S_{12}$ of the area R, whereas a side $S_1$ of the area $T_4$ and a side $S_{13}$ of the area R are positioned on a common reference line $A_{10}$. As a consequence, the side $S_1$ of the area $T_4$ is connected to the side $S_{13}$ of the area R to form a line segment. A side $S_3$ of the area $T_2$ is in contact with the side $S_{11}$ of the area R. A side $S_1$ of the area $T_2$ and a side $S_{14}$ of the area R are positioned on a common reference line $A_9$. A side $S_3$ of the area $T_3$ is in contact with the side $S_{13}$ of the area R. A side $S_1$ of the area $T_3$, the side $S_1$ of the area $T_2$ and the side $S_{14}$ of the area R are positioned on the reference line $A_9$ to form a line segment. Among the sides $S_1$ of the areas $T_1$ to $T_4$, the sides $S_1$ of the areas $T_2$ and $T_3$ are positioned on the reference line A extending in the x direction, whereas the sides $S_1$ of the areas $T_1$ and $T_4$ are positioned on their respective reference lines $A_8$ and $A_{10}$ extending in the y direction.

Figure 9B:
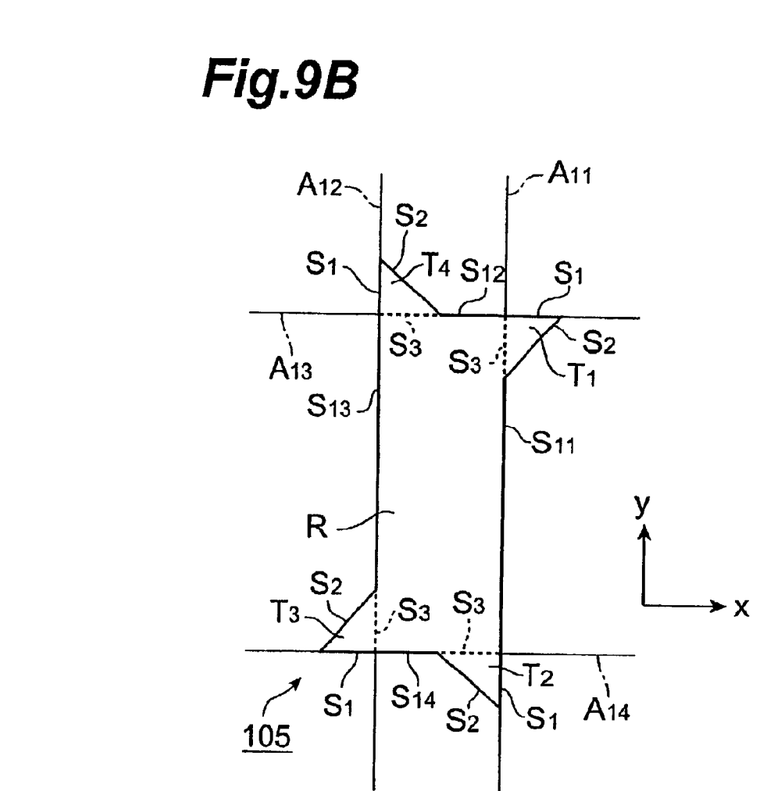

FIG. 9B is a plan view showing a pattern 105 of the photomask in accordance with an embodiment of the present invention. In the pattern 105, a side $S_3$ of the area $T_1$ is in contact with a side $S_{11}$ of the area R, whereas a side $S_1$ of the area $T_1$ is connected to a side $S_{12}$ of the area R, whereby a line segment is formed. A side $S_3$ of the area $T_2$ is in contact with a side $S_{14}$ of the area R, whereas a side $S_1$ of the area $T_2$ is connected to the side $S_{11}$ of the area R, whereby a line segment is formed. A side $S_3$ of the area $T_3$ is in contact with the side $S_{13}$ of the area R, whereas a side $S_1$ of the area $T_3$ is connected to the side $S_{14}$ of the area R, whereby a line segment is formed. A side $S_3$ of the area $T_4$ is in contact with the side $S_{12}$ of the area R, whereas a side $S_1$ of the area $T_4$ is connected to the side $S_{13}$ of the area R, whereby a line segment is formed. The sides $S_1$ of the areas $T_2$ and $T_4$ are positioned on the respective reference lines $A_{11}$ and $A_{12}$ extending in the y direction. The sides $S_1$ of the areas $T_1$ and $T_3$ are positioned on the respective reference lines $A_{13}$ and $A_{14}$ extending in the x direction.

If an etching mask is formed on the emitter film 6 with a photomask having at least one of the pattern 102 to 105 such that the side $S_{11}$ of the region R extends in [011] direction, then this etching process is carried out according to the etching method as explained in the first embodiment, whereby a rectangular emitter region is also obtained.

Figure 10:
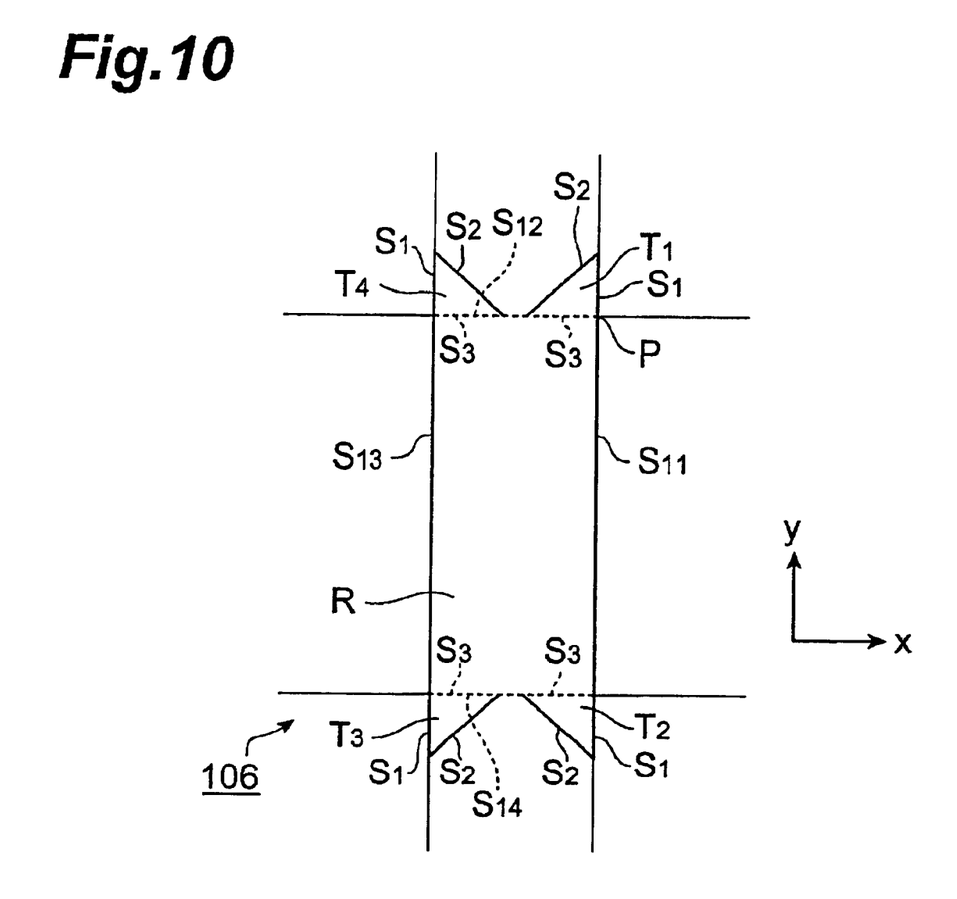
FIG. 10 is a plan view showing still another example of a photomask pattern shape.

FIG. 10 is a plan view showing a pattern 106 of a photomask in accordance with an embodiment of the present invention. The pattern 106 shown in FIG. 10 is a modification of the pattern shown in FIG. 3. The pattern 106 has projections $T_1$ and $T_4$ provided so as to extend from a side $S_{12}$, and has projections $T_2$ and $T_3$ provided so as to extend from a side $S_{14}$. The side $S_{12}$ appears between the projections $T_1$ and $T_4$, whereas the side $S_{14}$ appears between the projections $T_2$ and $T_3$. The sides $S_1$ of the protrusions $T_1$ and $T_2$ are aligned with a side $S_{11}$. The sides $S_1$ of the protrusions $T_3$ and $T_4$ are aligned with a side $S_{13}$.

Third Embodiment

Figure 11:
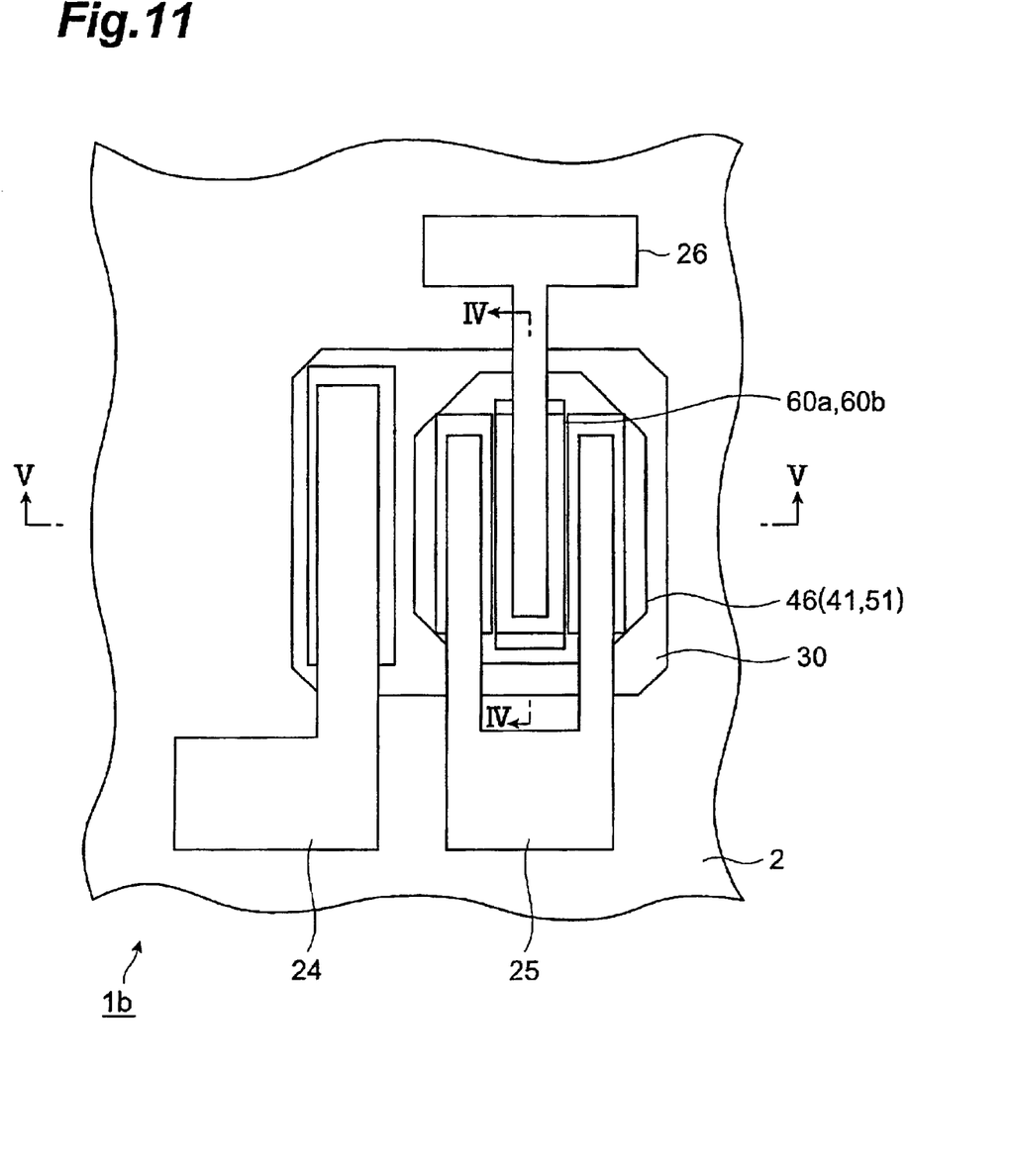
FIG. 11 is a plan view showing a heterojunction bipolar transistor in accordance with another embodiment.
Figure 12A:
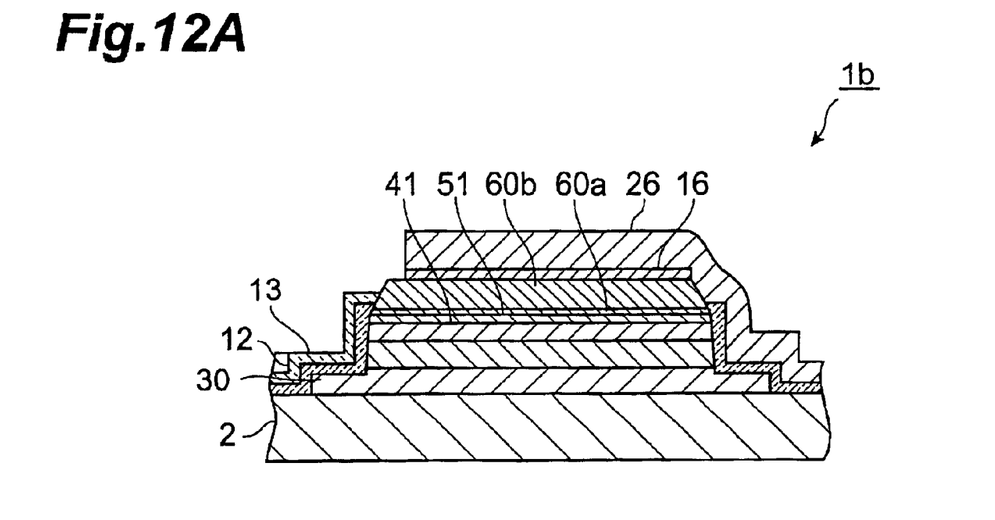
FIGS. 12A and 12B are sectional views showing the heterojunction bipolar transistor in accordance with the embodiment of FIG. 11.
Figure 12B:
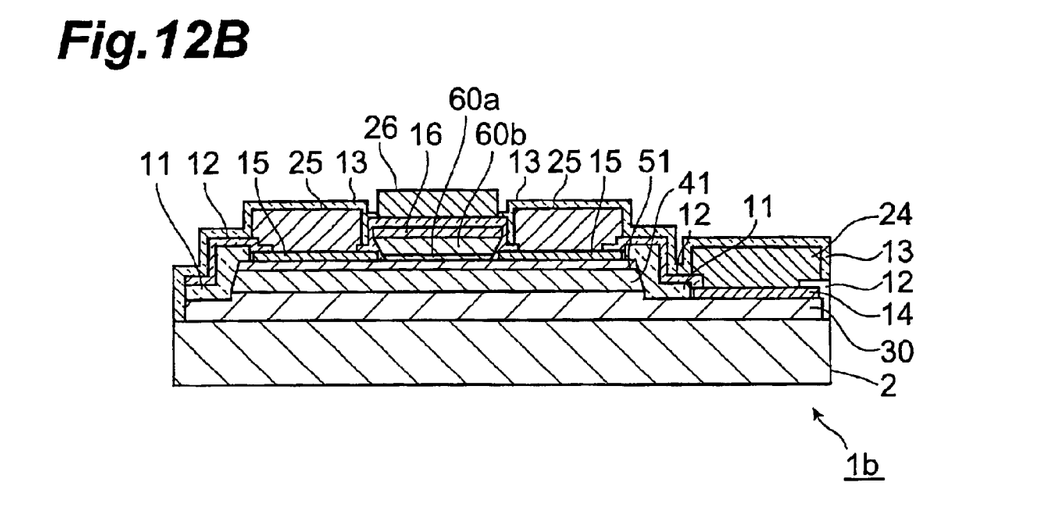

FIG. 11 is a plan view showing a heterojunction bipolar transistor 1b in accordance with an embodiment. FIG. 12A is a sectional view taken along the line IV—IV in FIG. 11. FIG. 12B is a sectional view taken along the line V—V in FIG. 11.

Referring to FIG. 11, a base-collector mesa 46 has a shape defined by eight sides. This shape can lower the capacitance between the base and the collector. Making the base-collector mesa 46 into a hexagonal shape does not substantially increase the base resistance. The base-collector mesa 46 comprises a base semiconductor layer 51 and a collector semiconductor layer 41. As materials for these semiconductor layers, those used in the first embodiment can also be employed. A base wiring lead 25 is provided so as to extend in a direction opposite from an emitter wiring lead 26.

In this embodiment, the emitter layer comprises a multilayer structure including an InP semiconductor portion 60b and an InGaAs semiconductor portion 60a provided thereon. In this configuration, a mixed solution of phosphoric acid, hydrogen peroxide, and pure water ($H_3PO_4:H_2O_2:H_2O=$ 5:1:10) can be used as an etching solution for etching the InGaAs semiconductor portion 60a. After this etching process, the InP semiconductor portion 60a is etched by use of another mixed solution of hydrochloric acid and pure water ($HCl:H_2O=3:5$).

The transistor 1b has a pair of sides of the emitter mesa. Each side of the emitter mesa has a normal tapered surface as shown in FIG. 12A. The transistor 1b has the other pair of sides of the emitter mesa. Each side has an inverse tapered surface as shown in FIG. 12B.

The method of making a bipolar transistor in accordance with the present invention is explained in the foregoing concerning some embodiments. As can be seen, the present invention can be modified in various manners without being restricted to the above-mentioned embodiments. For example, the lengths of the sides $S_1$ and $S_2$ of the areas $T_1$ to $T_4$ can be changed as required. Also, the shape of the areas $T_1$ to $T_4$ is not limited to a rectangular equilateral triangle. The shape of the formed emitter region 60 may be a square shape as well.

In the above-mentioned embodiments, one photomask having at least one of the patterns shown in FIGS. 3, 8A, 8B, 9A, 9B and 10 is used for forming an etching mask, but a plurality of photomasks maybe used for forming the etching mask.

In the above-mentioned embodiments, the etching mask used for forming the emitter layer 60 is formed from a resist film, it may also be made of a metal film, a silicide film such as WSi, or a dielectric film such as $SiO_2$ or $SiN_x$.

In the above-mentioned embodiments, MOCVD method is used for depositing the semiconductor films 3 to 6, but the method is not limited thereto. Other vapor phase epitaxy methods, such as CBE (Chemical Beam Epitxy) methods and liquid phase epitaxy methods, can also be used. Also, in the above-mentioned embodiments, appropriate etching methods can be employed for forming the collector-base mesa and contact holes without being limited to the method of the above-mentioned embodiments.

Further, the method of making a bipolar transistor in accordance with the present invention is applicable to the making of various bipolar transistors such as GaAs/AlGaAs system transistor formed on a GaAs substrate or GaAs/InGaP system transistor formed on a GaAs substrate without being limited to the above-mentioned transistor formed on the InP substrate.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of making a heterojunction bipolar transistor, said method comprising the steps of:

forming a mask layer on a compound semiconductor film by a photomask for forming an emitter mesa; and forming said emitter mesa by wet-etching said compound semiconductor film by said mask layer;

wherein said photomask has a pattern thereon for forming said emitter mesa;

wherein said pattern is defined by a first area portion associated with a shape of said emitter mesa to be formed, and a plurality of second area portions; and wherein each of said second area portions has first and second sides meeting each other to form an acute angle therebetween, and a third side in contact with said first area portion.

2. A method of making a heterojunction bipolar transistor according to claim 1, wherein said first area portion is defined by a first pair of sides extending in a first direction, and a second pair of sides extending in a second direction intersecting said first direction; and wherein each of said second area portions is arranged such that said third side is in contact with one of said first pair of sides of said first area portion.

3. A method of making a heterojunction bipolar transistor according to claim 1, wherein each of said second area portions is formed into a triangle defined by said first to third sides; and wherein said first side of each second area portion is oriented in a direction in which one of said first and second pairs of sides extends.

4. A method of making a heterojunction bipolar transistor according to claim 1, wherein said emitter mesa has a first pair of sides extending in a predetermined direction, and a second pair of sides extending in a direction intersecting said predetermined direction.

5. A method of making a heterojunction bipolar transistor according to claim 4, wherein an inverted mesa structure is formed at said first pair of sides in said emitter mesa and a normal mesa structure is formed at said second pair of sides in said emitter mesa in said wet-etching step.

6. A method of making a heterojunction bipolar transistor according to claim 1, wherein said first area has a pair of edges extending in crystal axis [011] direction of said compound semiconductor film.

7. A method of making a heterojunction bipolar transistor according to claim 1, wherein said compound semiconductor film includes an InP semiconductor.

8. A method of making a heterojunction bipolar transistor according to claim 7, wherein said mask layer is made of resist.

9. A method of making a heterojunction bipolar transistor according to claim 7, further comprising a step of forming an InGaAs base region essentially constituted by eight sides.

10. A method of making a heterojunction bipolar transistor according to claim 7, wherein said first area has a pair of edges extending in crystal axis [011] direction of said compound semiconductor film; and said method further comprising the steps of:

forming said compound semiconductor film prior to said step of forming said mask layer;

forming an InGaAs base region after said step of forming an emitter mesa; and forming an emitter electrode and a pair of base electrodes in a self-alignment fashion with respect to said emitter mesa after said step of forming a said base region.

* * * * *